(12) United States Patent
Lanio

(10) Patent No.: US 8,481,958 B2
(45) Date of Patent: Jul. 9, 2013

(54) MULTI-AXIS LENS, BEAM SYSTEM MAKING USE OF THE COMPOUND LENS, AND METHOD OF MANUFACTURING THE COMPOUND LENS

(75) Inventor: Stefan Lanio, Erding (DE)

(73) Assignee: ICT Integrated Circuit Testing Gesellschaft fur Halbleiterpruftechnik GmbH, Heimstetten (DE)

( * ) Notice: Subject to any disclaimer, the term of this patent is extended or adjusted under 35 U.S.C. 154(b) by 281 days.

(21) Appl. No.: 12/856,152

(22) Filed: Aug. 13, 2010

(65) Prior Publication Data

US 2012/0037813 A1 Feb. 16, 2012

(30) Foreign Application Priority Data

Aug. 11, 2010 (EP) .................................... 10172528

(51) Int. Cl.
*G21K 5/04* (2006.01)

(52) U.S. Cl.
USPC .................. 250/396 R; 250/397; 250/396 ML

(58) Field of Classification Search
USPC ........... 250/396 R, 397, 398, 396 ML, 492.1, 250/492.2, 492.3
See application file for complete search history.

(56) References Cited

U.S. PATENT DOCUMENTS

| 3,736,423 | A | * | 5/1973 | Katagiri et al. | ........ 250/396 ML |
| 4,209,702 | A | * | 6/1980 | Shirai et al. | ............ 250/396 ML |
| 2003/0001095 | A1 | | 1/2003 | Lo et al. | |
| 2005/0230633 | A1 | * | 10/2005 | Lo et al. | ................. 250/396 ML |
| 2006/0151713 | A1 | | 7/2006 | Adamec | |

FOREIGN PATENT DOCUMENTS

GB      2 001 799      7/1978

OTHER PUBLICATIONS

Extended European Search Report dated May 26, 2011 European Patent Application No. 10172528.1.

* cited by examiner

*Primary Examiner* — Nicole Ippolito
(74) *Attorney, Agent, or Firm* — Patterson & Sheridan, LLP

(57) ABSTRACT

A lens system for a plurality of charged particle beams comprises a lens body with a first pole piece, a second pole piece and a plurality of lens openings for the respective charged particle beams; a common excitation coil arranged around the plurality of lens openings for providing a respective first magnetic flux to the lens openings; and a compensation coil arranged between the lens openings for providing a respective second magnetic flux to at least some of the lens openings so as to compensate for an asymmetry of the first magnetic flux.

19 Claims, 3 Drawing Sheets

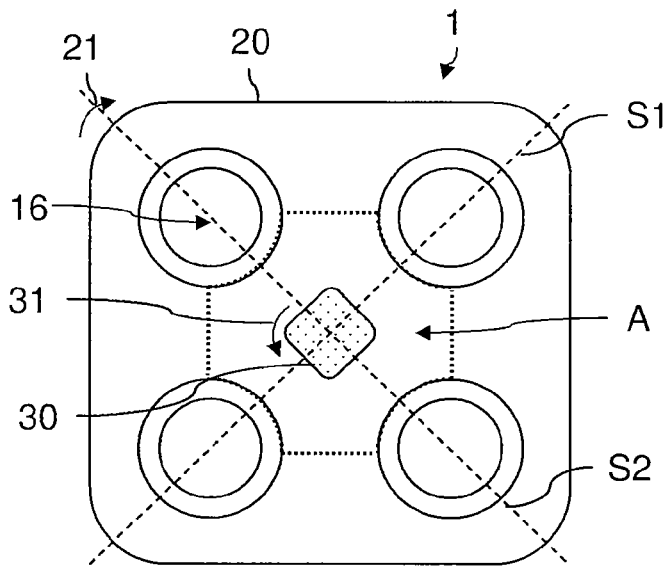
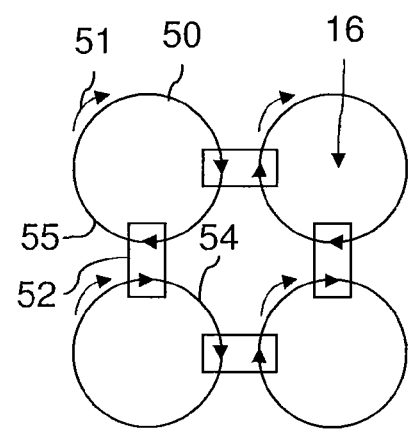
FIG. 1  FIG. 3
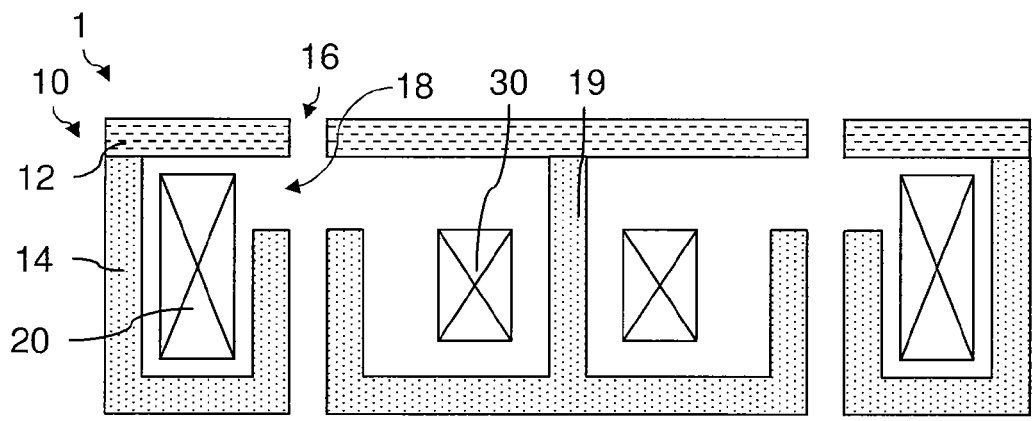
FIG. 2a
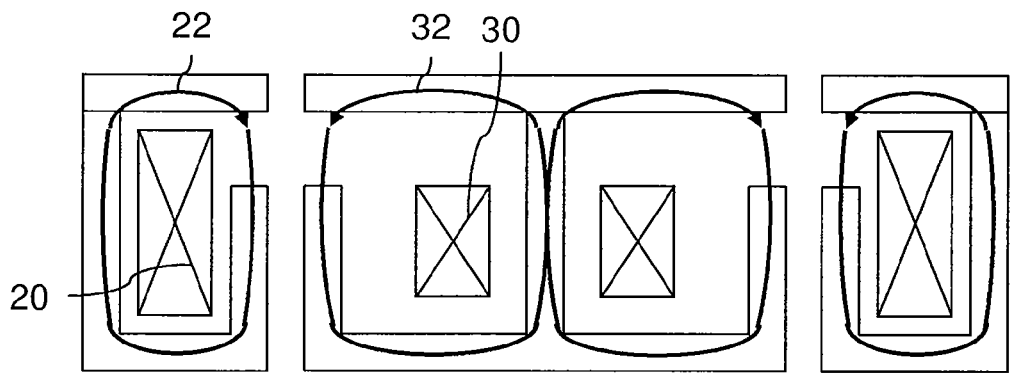
FIG. 2b

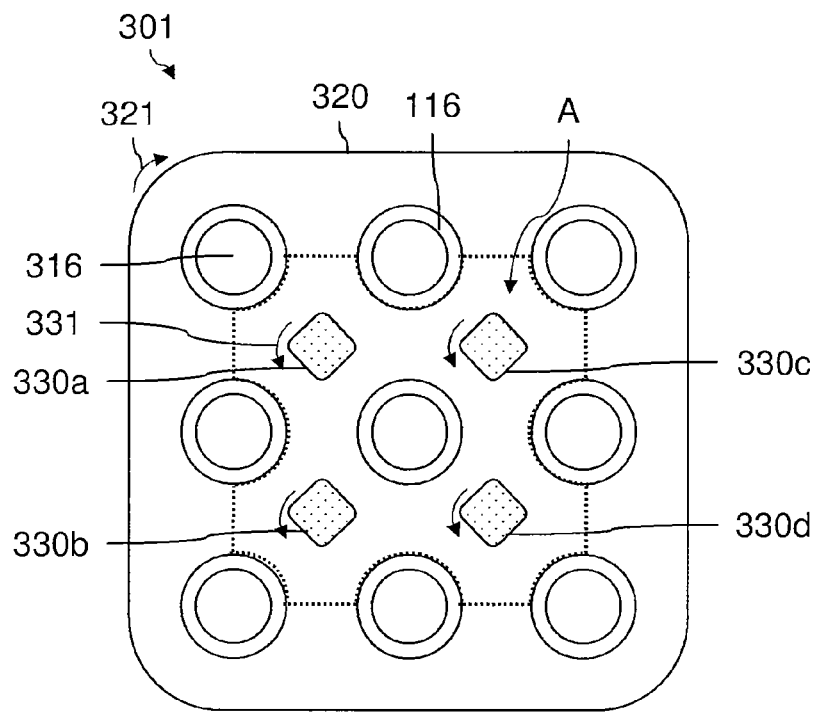
FIG. 6
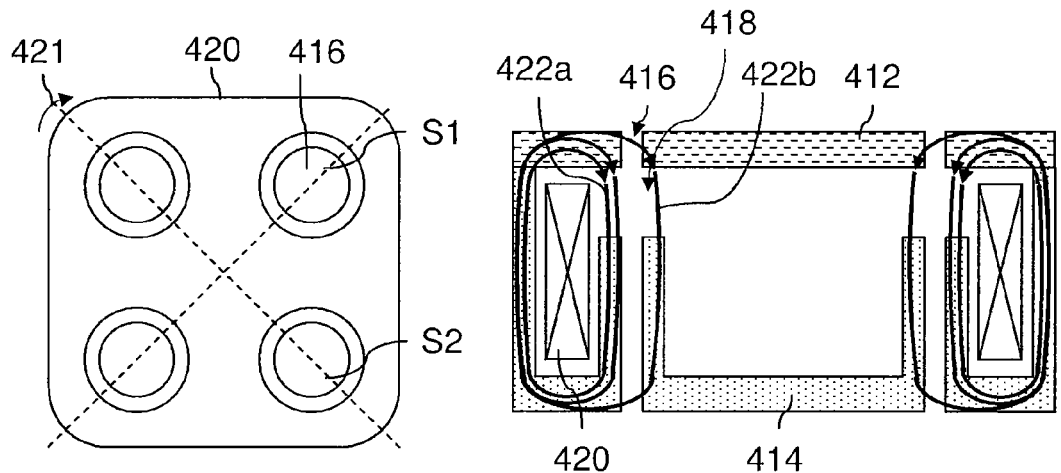
FIG. 7   FIG. 8

US 8,481,958 B2

MULTI-AXIS LENS, BEAM SYSTEM MAKING USE OF THE COMPOUND LENS, AND METHOD OF MANUFACTURING THE COMPOUND LENS

FIELD OF THE INVENTION

Aspects of the invention relate to a lens system for multiple-beam charged particle applications, such as inspection system applications, testing system applications, lithography system applications and the like. In particular, aspects of the invention relate to a lens system for a plurality of charged particle beams, especially to a lens system comprising a plurality of lens openings for the respective charged particle beams, and hence to a lens system for multi-beam applications. Further aspects of the invention relate to a multiple charged particle beam device, and to a method for operating a charged particle beam device.

BACKGROUND OF THE INVENTION

Charged particle beam apparatuses are used in a plurality of industrial fields. Testing of semiconductor devices during manufacturing, exposure systems for lithography, detecting devices and inspection systems are some examples of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices, such as electron microscopes, electron beam pattern generators or charged particle inspection systems. Charged particle beams offer superior spatial resolution compared to e.g. photon beams due to their short wavelengths.

However, for a given beam diameter, the charged particle beam current limits the throughput of charged particle beam systems. Since further miniaturization of e.g. structures to be imaged is necessary, the charged particle beam diameter has to be decreased. As a result, the beam current for individual beams, and thus the throughput, is decreased.

In order to increase the total charged particle beam current, thus increasing the throughput, a plurality of charged particle beams can be used. In this manner, the throughput can be increased proportional to the number of columns in a multi-column system.

One option for obtaining a plurality of charged particle beams may be combining several single beam columns with each other. However, some components, especially magnetic lenses, cannot be miniaturized sufficiently, since the magnetic field cannot be arbitrarily increased. Thus, the columns have to be spaced such that the distance between electron beams is 100 mm to 200 mm.

To overcome this problem, U.S. Pat. No. 3,715,580 utilizes a magnetic lens with a circular excitation coil providing two holes, each for a single electron beam. Thereby, the continuous rotational symmetry of previous lenses is abandoned since the hole (optical axis) for each electron beam has different distances from the position of the excitation coil. This lack of symmetry of the magnetic focusing field results in additional aberrations, and thus reduces the obtainable resolution.

Further, U.S. Pat. No. 7,576,917 describes a multi-axis lens with identical individual sub-units. The multi-axis lens allows close packing of lenses in a one dimensional array, but there remains a desire to reduce the spacing even further. Especially with the multi-axis lens, the spacing to a neighboring second array remains large.

Since there is a strong desire for improving resolution, for simplifying manufacturing and for minimizing aberrations in such systems, it is an object of the present invention to further improve state of the art devices.

SUMMARY

In view of the above, a lens system according to independent claim 1, a multiple charged particle beam device according to claim 14, and a method according to independent claim 15 are provided. Further advantages, features, aspects and details are apparent from the dependent claims, the description and drawings.

According to one embodiment, a lens system for a plurality of charged particle beams comprises: A lens body with a first pole piece, a second pole piece and a plurality of lens openings for the respective charged particle beams; a common excitation coil arranged around the plurality of lens openings for providing a respective first magnetic flux to the lens openings; and a compensation coil. The compensation coil is arranged between the lens openings for providing a respective second magnetic flux to at least some of the lens openings so as to compensate for an asymmetry of the first magnetic flux.

According to a further embodiment, a method for operating a charged particle beam device comprises: Generating a plurality of charged particle beams; guiding each of the charged particle beams through a respective one of a plurality of lens openings of a lens body; generating a current, in a first direction, in a common excitation coil arranged around the plurality of lens openings, thereby providing a respective first magnetic flux to the lens openings; and generating a current, in a second direction opposite to the first direction, in a compensation coil arranged between the lens openings, thereby providing a respective second magnetic flux to at least some of the lens openings and compensating for an asymmetry of the first magnetic flux.

The lens system described herein thus allows for close packing of multiple charged particle beams such as electron beams and hence close packing of multiple charged particle beam columns. Accordingly, the lens system allows for the design of Multi-Column Electron Beam Systems with high throughput. The design especially allows for closely-packed electron beams arranged in two dimensions. A two-dimensional arrangement is advantageous for many applications, e.g. if the sample to be scanned and inspected is relatively small.

The lens system described herein also allows for a relatively symmetrical focusing field and, hence, for reduced aberrations. Thus, charged particle beams with small spot size and a correspondingly high resolution can be achieved.

Embodiments are also directed at apparatuses for carrying out the disclosed methods and including apparatus parts for performing each described method step. These method steps may be performed by way of hardware components, a computer programmed with the appropriate software, by any combination of the two or in any other manner. Furthermore, embodiments according to the invention are also directed at methods by which the described apparatus operates. It includes method steps for carrying out all functions of the apparatus.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 1 shows a schematic top view of a lens system according to an embodiment of the invention;

FIGS. 2a and 2b show schematic side views of the lens system of FIG. 1;

FIG. 3 shows an illustrative current diagram useful for understanding the advantages of the system of FIG. 1;

FIGS. 4 to 6 show schematic top views of lens systems according to respective further embodiments of the invention;

FIG. 7 shows a schematic top view of a lens system according to an illustrative example useful for understanding the invention; and FIG. 8 shows a side view of the lens system of FIG. 7.

DETAILED DESCRIPTION OF THE INVENTION

Figure 4:
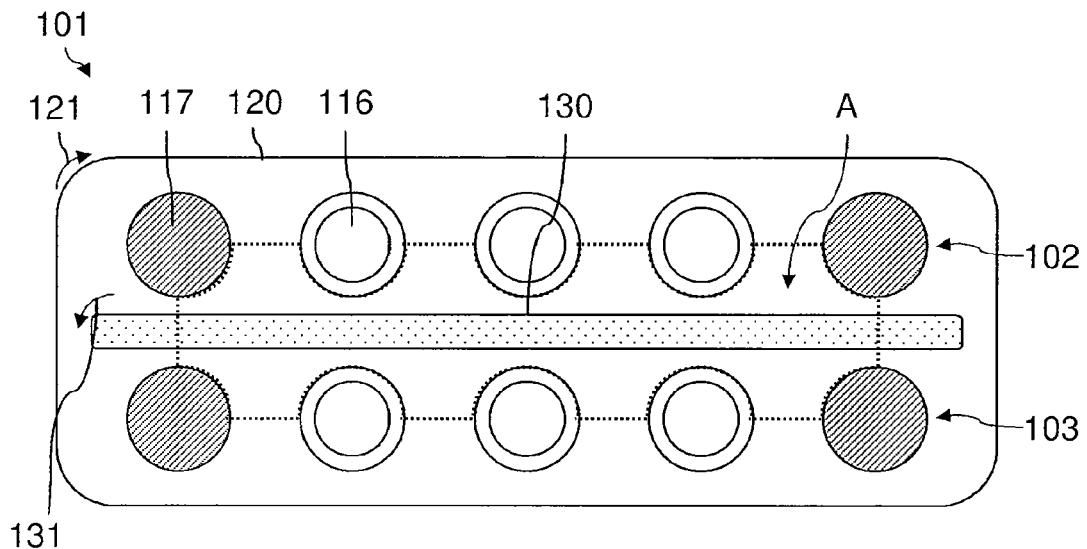

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following the charged particle multi-beam device will exemplarily be referred to as an electron multi-beam device. Thereby, an electron beam device with a plurality of electron beams might especially be an electron beam inspection system. The present invention can still be applied for apparatuses using other sources of charged particles, e.g. ions, for inspection, testing and lithography applications and, in the case of detection devices, other secondary charged particles to obtain a specimen image or the like.

With reference to FIGS. 7 and 8, a lens system according to an illustrative example useful for understanding the invention will be described. As seen in the top view of FIG. 7, the lens system has a lens body with four lens openings or lens bores 416 arranged in a 2×2-array, for four electron beam columns. Further, a common excitation coil 420 is arranged around the lens openings 416. Further, as seen in the cross-sectional side view of FIG. 8, the lens body has a first pole piece 412, a second pole piece 414, and respective gaps 418 between the upper and lower pole pieces 412, 414 surrounding the lens openings 416. The pole pieces are made of permalloy, µ-metal or any other magnetic conductive material. If a current is applied to the excitation coil 420, as indicated by the current arrow 421 of FIG. 7, a magnetic flux field B (in short: magnetic field) will be applied to the lens openings 416, as indicated by the magnetic flux lines 422a, 422b, for focusing the electron beam.

The lens system of FIGS. 7 and 8 allows for a closely-packed two-dimensional array of lenses. This design, however, has the drawback that the magnetic flux field B (lines 422a, 422b) created by the excitation coil 420 is not rotationally symmetrical and therefore creates aberrations of the electron beam.

The asymmetry can be understood in terms of the free energy stored in the magnetic field, $U=(H \cdot B)/2$. Here, B is the free magnetic flux field due to the excitation coil current, and $H=B/(\mu_r \cdot \mu_0)$, $\mu_r$ being the magnetic permittivity of the material and $\mu_0$ being a constant. The field B takes a spatial configuration that minimizes the free energy U.

In the ideal case of infinite magnetic permittivity $\mu_r$ inside the pole pieces 412, 414, the magnetic flux inside the pole pieces 412, 414 would not contribute to the free energy because H=0. Instead, only the portion of the magnetic field traversing the gap between the upper pole piece 412 and the lower pole piece 414 would contribute to the free energy. Hence, assuming that the gap is rotationally symmetrical about each of the lens openings 416, the resulting magnetic flux field B would also be perfectly rotationally symmetrical. In the case of a perfectly rotationally symmetrical flux field, an electron beam traveling on the optical axis (symmetry axis) of the lens would be influenced by the field without introducing astigmatism.

However, due to the limited permittivity $\mu_r$ of the magnetic material and due to saturation effects, the magnetic flux inside the pole pieces 412, 414 and their contribution to the free energy U will not be negligible. Hence, the magnetic flux field will be non-symmetrical, with portions close to the coil (flux lines 422a), obtainable at less free energy at a given field strength, having a stronger magnetic field than portions far away from the coil (flux lines 422b). Thus, the magnetic flux field will be stronger at portions of the lens openings 416 near the periphery of the lens body (closer to the coil 420), and weaker at portions of the lens openings 416 near the center of the lens body (farther away from the coil 420). As a result, the individual lens portions will generally have inhomogeneous strengths and an asymmetry that will result in astigmatism and similar unwanted effects of the electron beam.

Due to these asymmetries, a magnetic field gradient inside the lens opening creates a dipole effect resulting in parasitic beam deflection. Also, a quadrupole magnetic field component is created (with the poles oriented along the diagonals of FIG. 7), inducing strong astigmatism. Also, higher order multipoles will be created, e.g. a strong hexapole, which deteriorate spot size in high current systems with large bundle diameters and therefore cannot be neglected.

For reducing these asymmetries of the magnetic flux field, in an alternative illustrative setup useful for understanding the invention each lens opening could be provided with an individual excitation coil surrounding the respective lens opening (as described with reference to FIG. 3 further below). However, this would result in a large distance between the lens openings, caused by the arrangement of the excitation coils between them.

In the following, embodiments of the invention will be described. These embodiments reduce the magnetic flux field asymmetries of the configuration of FIGS. 7 and 8 and their detrimental effects, and additionally allow for a compact setup.

FIGS. 1 and 2a show a lens system 1 according to an embodiment of the invention. As seen in the top view of FIG. 1, the lens system 1 has a lens body with four lens openings or lens bores 16 arranged in a 2×2-array, for four electron beam columns. Each of the lens openings 16 is circularly shaped and has a center, and defines an optical axis through the center. Further, a common excitation coil 20 is arranged around the lens openings 16.

Further, as seen in the cross-sectional side view of FIG. 2a, taken along plane S1 or S2, the lens body 10 has a first pole piece 12, a second pole piece 14, and respective gaps 18 between the upper and lower pole pieces 12, 14 surrounding the lens openings 16. The lens body 10 (the pole pieces 12, 14) are made of a magnetically conductive material, e.g. a material comprising permalloy or µ-metal. The lens body 10 thus provides a magnetically conductive circuit which confines a magnetic field essentially to the gap region 18 between upper pole piece 12 and lower pole piece 14. This magnetic field then causes an electron beam travelling axially through the lens opening 16 to be focused, as described above with reference to FIGS. 7 and 8. Further possible variations of the lens are described below.

Further, the lens system 1 has a compensation coil 30. The compensation coil 30 is arranged between the lens openings 16. Herein, an arrangement between the lens openings is to be understood as follows: At least a part of the compensation coil lies in an area between the lens openings. This area between the lens openings 16 is depicted as area A in FIG. 1. More generally, the area A between the lens openings is defined as the area (polygonal area) between centers of the lens openings, and excluding the area of the lens openings themselves.

The compensation coil 30 has the shape of a rectangle with rounded edges, but may have any other circular or non-circular shape. As a general aspect independent of the shown embodiment, the compensation coil 30 has a coil axis parallel to the coil axis of the excitation coil 20. As a further general aspect, no lens openings 16 are inside the compensation coil 30, i.e. all lens openings 16 are outside of the compensation coil 30. Instead, as a further general aspect, the compensation coil is arranged around a magnetic stub 19 (see FIG. 2a). The magnetic stub 19 provides an essentially gapless connection between the upper pole piece 12 and the lower pole piece 14, so that magnetic flux can extend between the upper pole piece 12 and the lower pole piece 14 with low magnetic resistance. As a further general aspect, the interior of the excitation coil 20 and/or the compensation coil 30 has a convex shape.

During operation, a current is applied to the excitation coil 20, as indicated by the current arrow 21 of FIG. 1, a magnetic flux field B (first magnetic flux 22) will be applied to the lens openings 16, as illustrated by the magnetic flux lines 22 of FIG. 2b, for focusing the electron beam in the same manner as described with reference to FIGS. 7 and 8. The flux lines 22 of FIG. 2b are a simplified illustration of the more detailed magnetic flux lines 422a, 422b of FIG. 8.

Further, a current is applied to the compensation coil 30, as indicated by the current arrow 31 of FIG. 1. This compensation coil current 31 is in a direction opposite to the direction of the excitation coil current 21. The compensation coil current 31 circles around the central stub of magnetic material 19 connecting the upper pole piece 12 and the lower pole piece 14. As can be seen in FIG. 2b, the compensation coil current 31 generates a compensation magnetic flux field 32 (also referred to as second magnetic flux or flux field) for the lens openings 16. The flux lines of the compensation magnetic flux field 32 are closed via the gaps 18 of the lens openings 16 and via the magnetic stub 19.

This inner stub of magnetic material 19, together with the compensation coil 30, thus has an important function. If excited appropriately, it creates the same magnetic potential difference in the central part of the multi-bore lens body as the outer coil in the outer part. Hence the radial potential drop across the individual lenses can be compensated for, or reduced. Here, to compensate for an asymmetry is understood to mean that the asymmetry is substantially reduced if not fully eliminated. In particular, the compensation coil allows for eliminating a dipole component of the lens fields by adjusting the compensation current appropriately. Also, higher order multipoles responsible for quadrupole and hexapole astigmatism can be reduced substantially. An appropriate excitation of the compensation coil 30 may be, for example, an excitation to the same number of Ampturns as the excitation coil 20.

The compensation flux field 32 compensates for, at least partially, the asymmetry of the first flux field 22 as follows: The first flux field 22 is stronger at portions of the lens openings 16 near the periphery of the lens body 10 (closer to the coil 20), and weaker at portions of the lens openings 16 near the center of the lens body 10 (farther away from the coil 20). In contrast, the compensation flux field 32 has the opposite field distribution, and is weaker at portions of the lens openings 16 near the periphery of the lens body 10 (farther away from the coil 30), and stronger at portions of the lens openings 16 near the center of the lens body 10 (closer to the coil 30). When superimposed, the inhomogeneities—e.g. higher-order magnetic multipole moments—of the total magnetic field (sum of fields 22 and 32) cancel out at least partially. As a result, the total magnetic field has, overall, less inhomogeneities than the field 22, especially a lower dipole moment in a radial direction of coil 20. In other words, an asymmetry of the first magnetic flux (flux field) 22 is compensated for, i.e. reduced, by the second magnetic flux (flux field) 32.

Hence, the total field in the gap region 18 interacting with an electron beam traveling through the lens opening 16 is more symmetrical than the field of the comparative example shown in FIGS. 7 and 8. Therefore, the lens allows for reduced beam aberrations and higher obtainable resolution.

The lens system of FIG. 1 has some symmetries, notably mirror symmetries with respect to two planes S1 and S2 perpendicular to the drawing plane of FIG. 1. These symmetries reduce some of the higher-order magnetic multipole fields and therefore contribute to a more uniform and aberration-free focusing field. In particular, each lens opening 16 has a magnetic lens field which is symmetrical to plane S1 or S2. Further, as described above, for each lens opening 16, the dipole moment perpendicular to S1 or S2 can also be eliminated by tuning the compensation current appropriately. Thereby, as a general aspect, during operation, a lens field for each of the lens openings 16 has at least one plane of symmetry and can have at least two planes of symmetry, the at least one plane of symmetry containing the respective optical axis.

With reference to FIG. 3, the asymmetry compensating effect of the compensation coil 30 can be understood by starting from a further comparative example: In the comparative example, each of the lens openings 16 is provided with an individual coil 50 surrounding the respective lens opening 16 and carrying currents 51. This setup thus produces a highly desirable magnetic flux field, but at a cost: The setup of FIG. 3 requires a large distance between the lens openings 16 due to the excitation coil portions arranged between them, mainly in regions 52.

The setup of FIG. 1 produces a magnetic flux that is very similar to the flux produced by the example of FIG. 3, and at the same time disposes of the excitation coil portions arranged between the lens openings, thereby allowing for a more compact setup. Namely, it is crucial to realize that these excitation coil portions in region 52 can be omitted without significantly affecting the magnetic field: in the regions 52, currents from neighboring coils 50 flow in opposite directions, as indicated by the arrows on the respective coils 50 inside regions 52. These neighboring currents largely cancel out and are therefore ineffective for the resulting magnetic flux field.

In the setup of FIG. 1, a current, and hence magnetic flux, is obtained which corresponds to the current of FIG. 3, and in which the ineffective and space-consuming portions of the coils 50 in regions 52 are omitted. Namely, the current 21 of coil 20 shown in FIG. 1 corresponds to the current of the outer portions 55 of the coils 50 shown in FIG. 3 (the coil portions towards the outside of regions 52). Further, the current 31 of coil 30 shown in FIG. 1, being arranged between the lens openings 16, corresponds to the current of the inner portions 54 of the coils 50 shown in FIG. 3 (the coil portions arranged inside the regions 52, i.e. between the lens openings). Thus, by comparing FIG. 3 with FIG. 1, it can be understood that as long as the compensation coil 30 is arranged between the lens openings 16, its magnetic flux will compensate for an asymmetry of the magnetic flux of the excitation coil 20. As a general aspect, the compensation coil 30 is arranged such that more than half, or even more than ⅔, or even more than 90% of its effective area is between the lens openings (in area A in FIG. 1), so that a corresponding portion of the compensation flux is generated between the lens openings.

Thus, the currents of FIG. 1 correspond to the currents of FIG. 3, with the ineffective parts in regions 52 removed, and the coils re-connected in a more advantageous manner, allowing the current to flow only in the relevant parts. By removing the ineffective parts from the coils and, at the same time, providing a current which improves the homogeneity of the lens fields, the column pitch is reduced and the uniformity of the multi-bore lens field is increased.

Further, the wavy current path one would obtain in this manner from FIG. 3 is rectified to a convex shape. Thereby, one gains even more valuable space and can move the lenses closer to each other. As a general aspect, the excitation coil 20 and/or the compensation coil 30 are convex-shaped.

Now referring to FIG. 4, a lens system 101 according to a further embodiment of the invention will be described. The lens system 101 comprises lens openings 116, 117, an excitation coil 120 carrying an excitation current 121, and a compensation coil 130 carrying a compensation current 131, and arranged at least partially between the lens openings 116, 117. The lens system 101 of FIG. 4 generally corresponds to the lens system 1 of FIGS. 1 to 2b, with the modifications obvious from the drawings. For example, the compensation coil 130 is also arranged around a magnetic stub, corresponding to stub 19 of FIG. 2a and providing an essentially gapless connection between a first pole piece and a second pole piece. In the following, only the differences with respect to the lens system 1 will be described.

In the lens system 101 of FIG. 4, the lens openings 116, 117 are arranged as a two-dimensional array of two rows 102, 103, and five columns. Further, the lens openings 117 of the outermost columns (at the longitudinal ends of the array) are provided as dummy openings. These dummy openings 117 are not used to focus an electron beam. The remaining lens openings 116 arranged in the three inner columns, also referred to as active lens openings 116, are used for focusing charged particle beams.

Further, the compensation coil 130 is arranged between the lens openings 116, 117 (i.e. at least partially in the area A between the lens openings 116, 117), and in particular is arranged between the active lens openings 116. Hereby, in contrast to the arrangement of FIG. 1, a small part of the compensation coil 130 is also arranged outside the area A. Due to this part outside the area A, homogeneity of the magnetic flux is increased, and the part does not, in any case, have any detrimental influence on the magnetic flux relevant for the active lens openings 116. Nevertheless, more than 80% of the effective area of the compensation coil 130 is inside the area A, and more than half of the effective area is in the area between the active lens openings 116.

Figure 5:
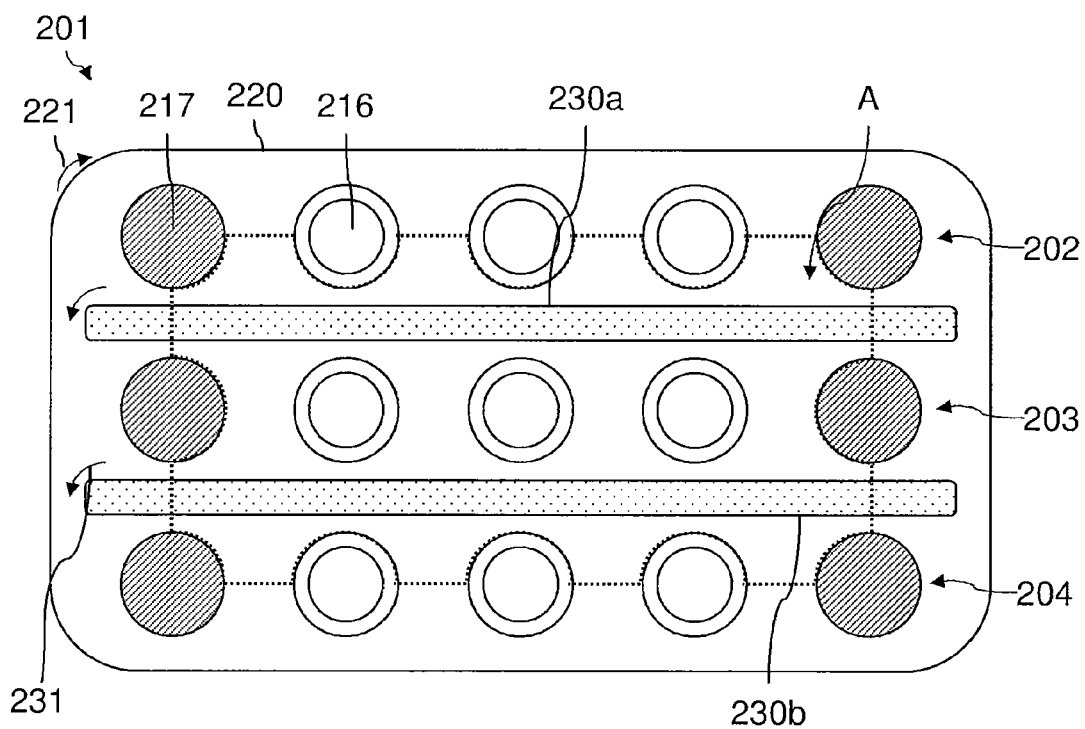

With reference to FIG. 5, a lens system 201 according to a further embodiment of the invention will be described. The lens system 201 is very similar to the lens system 101 of FIG. 4, with reference numbers 2xx corresponding to the reference numbers 1xx of FIG. 4. As the main difference with respect to the lens system 101 of FIG. 4, the lens system 201 has three rows 202, 203, 204 of lens openings 216, 217, with two compensation coils 230a, 230b arranged between. For all further details, the description of FIG. 4 applies to FIG. 5 as well. FIG. 5 illustrates that any number of rows and columns can be used. Also, the lens openings 116, 117 may also be arranged in any other manner, e.g. in a hexagonal manner. Also, more than one dummy lens opening 117 or no dummy lens openings may be provided at each side.

In a further variation (not shown) of the embodiments of FIGS. 4 and 5, shielding plates may be provided at both ends of the linear lens array. These shielding plates can be combined with the dummy lens openings 117, 217 of FIGS. 4 and 5, respectively, or can be used independently of or instead of the dummy lens openings. The shielding plates have two effects. On the one hand, the influence of the loop of the excitation currents at the end of the linear lens array is shielded. On the other hand, a magnetic neighborhood (periphery) can be provided as if the linear lens array were infinitely long. The structure of the shielding plate and their effects are described in FIGS. 7a and 7b of U.S. Pat. No. 7,576,917 and the description thereof, which are hereby incorporated in the present application. The aspects presented above, namely to provide dummy lens openings and/or to provide shielding plates, can be used independently for all kinds of lens systems.

An advantage of the lens systems 101 and 201 of FIGS. 4 and 5 is that these lens systems bring a plurality of rows of 3 or more columns into close proximity, while at the same time providing the benefit of dipole compensation and astigmatism minimization as described above, due to the addition of the compensation coil.

The design especially allows for closely-packed electron beams arranged in two dimensions. A two-dimensional arrangement is advantageous for many applications, e.g. if the sample to be scanned and inspected is relatively small, as is the case in wafer mask defect inspection. In this case the mask area is on the order of 100 mm×100 mm and should be scanned simultaneously by at least 4 columns, hence the column pitch in both directions should be about 50 mm. As a general aspect, centers of neighboring lens openings are spaced from one another by less than 100 mm, or less than 75 mm, or even 50 mm or less. Using a miniature compensation coil, a spacing as low as 40 mm can be achieved.

With reference to FIG. 6, a further lens system 301 is described. The lens system 301 is very similar to the lens system 1 of FIG. 1, with reference numbers xx of FIG. 1 corresponding to the reference numbers 3xx of FIG. 6. In the following, only differences with respect to FIG. 1 will be described. In the lens system 301 of FIG. 6, nine lens openings 316 are provided. The lens openings 316 are arranged in a 3×3 array. Further, each of the four compensation coils 330a to 330d are arranged between the lens openings. More precisely, each of the coils is arranged between four neighboring lens openings 116, the neighboring lens openings forming a 2×2 sub-array. For example, each of the compensation coils 330a to 330d is arranged around a respective magnetic stub, corresponding to stub 19 of FIG. 2a.

The arrangement of the compensation coils 330a to 330d shown in FIG. 6 is particularly advantageous, as can be understood by reasoning analogously to the reasoning described above with reference to FIG. 3.

Now, possible further variations of the embodiments will be described. The lens has so far been described as a purely magnetic lens with a gap 18 between the upper pole piece 12 and the lower pole piece 14 (see e.g. FIG. 2a). The pole pieces 12, 14 and the gap 18 can be shaped in any suitable manner, and according to different shapes of lens systems, other arrangements of pole pieces can be realized. Radial gap lenses, for example, have an inner and an outer pole piece. The upper and lower pole piece are distinguished from one another by the gap 18, and while the lens body is usually made from the pole pieces as separate components and then assembled, the lens body, in principle, can also be formed as an integral one-piece component. As a general aspect, a gap in the region of the lens openings separates the first pole piece from the second pole piece. As a further general aspect, the first pole piece and/or the second pole piece are provided as a (respective) single body of magnetic material surrounding the plurality of lens openings. Thereby, magnetic flux is allowed to pass from one of the lens openings to the others with minimal magnetic resistance.

Also, the lens can be provided as an electrostatic-magnetic compound lens, with an electrostatic lens provided within the lens opening 16 of FIG. 2a. The electrostatic lens comprises two electrodes arranged symmetrically with respect to the optical axis. The two electrodes are used as an electrostatic immersion lens, whereby the imaging properties can be improved. Such a compound lens is described in FIG. 9 of U.S. Pat. No. 7,576,917 and the description thereof, which are hereby incorporated in the present application.

Also, an extra adjustment coil can be arranged around the respective lens openings. Such an extra adjustment corresponds to the coils 50 shown in FIG. 3. However, in contrast to FIG. 3, these adjustment coils are provided in addition to the excitation coil and the compensation coil and therefore need to provide only a weak adjustment field. For this reason, the adjustment coils can be provided with minimal spatial requirements.

Also, the excitation coil and the compensation coil can be connected in series so that the (same) current supplied to them is guided in mutually opposite directions, and the number of turns of the compensation coil is adjusted such as to provide a magnetic flux compensating for an asymmetry of the first magnetic flux.

The lens system described herein allows for producing a compact multiple charged particle beam device, having multiple charged particle beams with low beam spacing, possibly in two dimensions. Such a beam device has a charged particle beam source for generating a plurality of charged particle beams, and a charged particle beam column. The charged particle beam column comprises, besides elements typically used in beam columns, the lens system as described herein.

While the foregoing is directed to embodiments of the invention, other and further embodiments of the invention may be devised without departing from the basic scope thereof, and the scope thereof is determined by the claims that follow.

The invention claimed is:

1. Lens system for a plurality of charged particle beams, comprising:
a lens body with a first pole piece, a second pole piece and a plurality of lens openings for the respective charged particle beams;
a common excitation coil arranged around the plurality of lens openings for providing a respective first magnetic flux to the lens openings; and
a compensation coil arranged between the lens openings for providing a respective second magnetic flux to at least some of the lens openings so as to compensate for an asymmetry of the first magnetic flux, wherein the compensation coil is arranged such that axial extension of each of the lens openings is outside the compensation coil.

2. Lens system according to claim 1, wherein the compensation coil is arranged around a magnetic stub, the magnetic stub providing an essentially gapless connection between the first pole piece and the second pole piece.

3. Lens system according to claim 1, wherein the compensation coil is arranged such that all lens openings are outside of the compensation coil when viewed from an optical axis defined by the lens openings.

4. Lens system according to claim 1, wherein during operation the compensation coil carries a current in the opposite direction of a current carried by the excitation coil.

5. Lens system according to claim 1, wherein the lens openings are arranged in a two-dimensional arrangement.

6. Lens system according to claim 1, wherein the lens openings are arranged as an array having at least two rows and at least two columns.

7. Lens system according to claim 1, wherein the lens openings have, at least in one direction, a distance with respect to each other of less than 90 mm.

8. Lens system according to claim 1, wherein each one of the lens openings defines a respective optical axis and wherein during operation a lens field for each one of the openings has at least one plane of symmetry, the at least one plane of symmetry containing the respective optical axis.

9. Lens system according to claim 1, being symmetrical with respect to a plane of symmetry (S1, S2) containing a respective center of at least one of the lens openings.

10. Lens system according to claim 1, being symmetrical with respect to at least two planes of symmetry (S1, S2).

11. Lens system according to claim 1, wherein the plurality of lens openings is at least four lens openings.

12. Lens system according to any claim 1, further comprising, for each of the plurality of lens openings, an adjustment coil arranged around the respective lens opening.

13. Lens system according to claim 1, wherein at least one of the first pole piece and the second pole piece are provided as a single body of magnetic material.

14. Lens system according to claim 1, wherein in the region of the lens openings, a gap separates the first pole piece from the second pole piece.

15. Multiple charged particle beam device, comprising:
a charged particle beam source for generating a plurality of charged particle beams; and
a charged particle beam column comprising a lens system according to claim 1.

16. Method for operating a charged particle beam device, comprising:
generating a plurality of charged particle beams;
guiding each of the charged particle beams through a respective one of a plurality of lens openings of a lens body;
generating a current, in a first direction, in a common excitation coil arranged around the plurality of lens openings, thereby providing a respective first magnetic flux to the lens openings; and
generating a current, in a second direction opposite to the first direction, in a compensation coil arranged between the lens openings, thereby providing a respective second magnetic flux to at least some of the lens openings and compensating an asymmetry of the first magnetic flux, wherein the compensation coil is arranged such that axial extension of each of the lens openings is outside the compensation coil.

17. Method according to claim 16, wherein the lens openings are arranged as an array having at least two rows and at least two columns.

18. Method according to claim 16, wherein the lens openings have, at least in one direction, a distance with respect to each other of less than 90 mm.

19. Method according to claim 16, wherein the compensation coil is arranged such that all lens openings are outside of the compensation coil when viewed from an optical axis defined by the lens openings.

* * * * *